(12) United States Patent
Arai et al.

(10) Patent No.: US 10,468,480 B1
(45) Date of Patent: Nov. 5, 2019

(54) MOSFET AND POWER CONVERSION CIRCUIT

(71) Applicant: SHINDENGEN ELECTRIC MANUFACTURING CO., LTD., Chiyoda-ku, Tokyo (JP)

(72) Inventors: Daisuke Arai, Saitama (JP); Mizue Kitada, Saitama (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 0 days.

(21) Appl. No.: 16/342,201

(22) PCT Filed: Nov. 11, 2016

(86) PCT No.: PCT/JP2016/083610
§ 371 (c)(1),
(2) Date: Apr. 16, 2019

(87) PCT Pub. No.: WO2018/087899
PCT Pub. Date: May 17, 2018

(51) Int. Cl.
*H01L 29/06* (2006.01)
*H01L 29/10* (2006.01)
(Continued)

(52) U.S. Cl.
CPC ...... *H01L 29/0634* (2013.01); *H01L 29/1095* (2013.01); *H01L 29/1608* (2013.01);
(Continued)

(58) Field of Classification Search
None
See application file for complete search history.

(56) References Cited

U.S. PATENT DOCUMENTS

| 2005/0167742 A1 | 8/2005 | Challa et al. |
| 2006/0151806 A1 | 7/2006 | Fukuda et al. |

(Continued)

FOREIGN PATENT DOCUMENTS

| JP | 2012-64660 A | 3/2012 |
| JP | 2012-120362 A | 6/2012 |

(Continued)

OTHER PUBLICATIONS

International Search Report in PCT/JP2016/083610, dated Jan. 24, 2017, 4pp.

(Continued)

*Primary Examiner* — Jack S Chen
(74) *Attorney, Agent, or Firm* — Hauptman Ham, LLP

(57) ABSTRACT

Provided is a MOSFET which includes: a semiconductor base substrate having an n-type column region and a p-type column region, a base region and a source region, wherein a super junction structure is formed of the n-type column region and the p-type column region; a trench having side walls and a bottom; a gate electrode formed in the trench by way of a gate insulation film; a carrier compensation electrode positioned between the gate electrode and the bottom of the trench; an insulation region separating the carrier compensation electrode from the side walls and the bottom; and a source electrode electrically connected to the source region and also electrically connected to the carrier compensation electrode. According to the MOSFET of the present invention, even when an irregularity in a charge balance occurs around the gate, an irregularity in switching characteristics when the MOSFET is turned off can be decreased.

5 Claims, 7 Drawing Sheets

(51) Int. Cl.
  *H01L 29/40*   (2006.01)
  *H01L 29/78*   (2006.01)
  *H01L 29/868*  (2006.01)
  *H01L 29/16*   (2006.01)
  *H01L 29/872*  (2006.01)
  *H02M 7/5387*  (2007.01)
  *H02M 3/156*   (2006.01)

(52) U.S. Cl.
  CPC ........ *H01L 29/407* (2013.01); *H01L 29/7805* (2013.01); *H01L 29/7813* (2013.01); *H01L 29/868* (2013.01); *H01L 29/872* (2013.01); *H02M 3/156* (2013.01); *H02M 7/5387* (2013.01)

(56) References Cited

U.S. PATENT DOCUMENTS

| | | |
|---|---|---|
| 2008/0150073 A1 | 6/2008 | Willmeroth et al. |
| 2010/0025760 A1 | 2/2010 | Kawashima |
| 2011/0169103 A1* | 7/2011 | Darwish ............. H01L 29/7823 257/409 |
| 2012/0139512 A1 | 6/2012 | Usui |
| 2013/0307058 A1 | 11/2013 | Wahl et al. |
| 2013/0334598 A1 | 12/2013 | Okumura |
| 2015/0200248 A1 | 7/2015 | Ono et al. |
| 2016/0240614 A1 | 8/2016 | Okuhata et al. |
| 2019/0206988 A1* | 7/2019 | Padmanabhan ..... H01L 29/0634 |

FOREIGN PATENT DOCUMENTS

| | | |
|---|---|---|
| JP | 2012-234848 A | 11/2012 |
| JP | 2013-258327 A | 12/2013 |
| JP | 2015-80321 A | 4/2015 |
| JP | 2015-133380 A | 7/2015 |

OTHER PUBLICATIONS

Search Report in NL Application No. 2019846, dated Aug. 2, 2018, 11 pp.

* cited by examiner

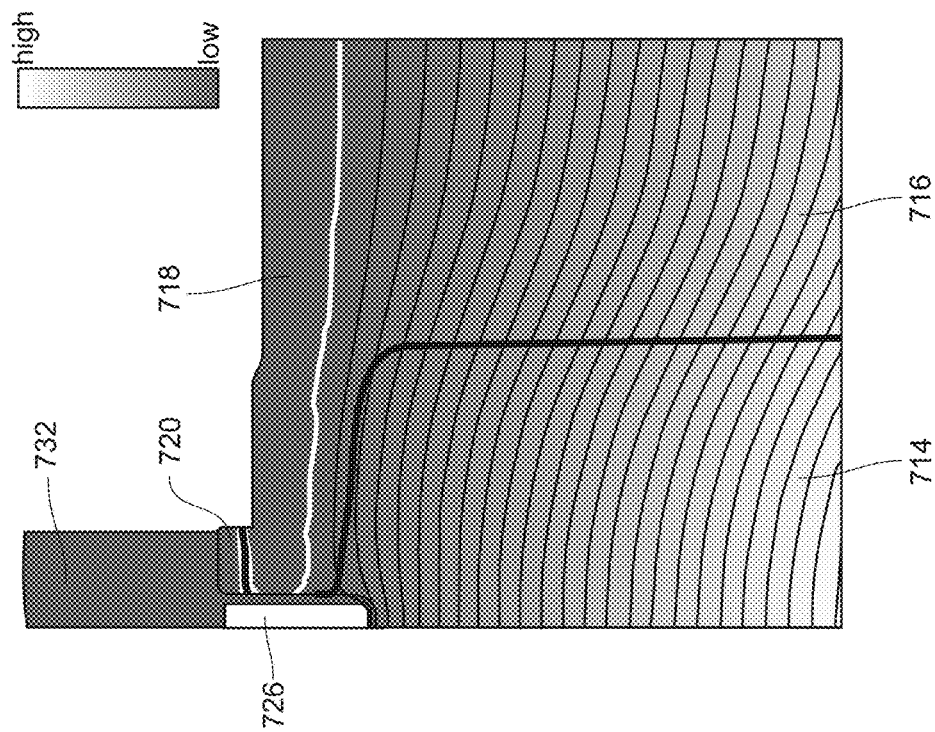
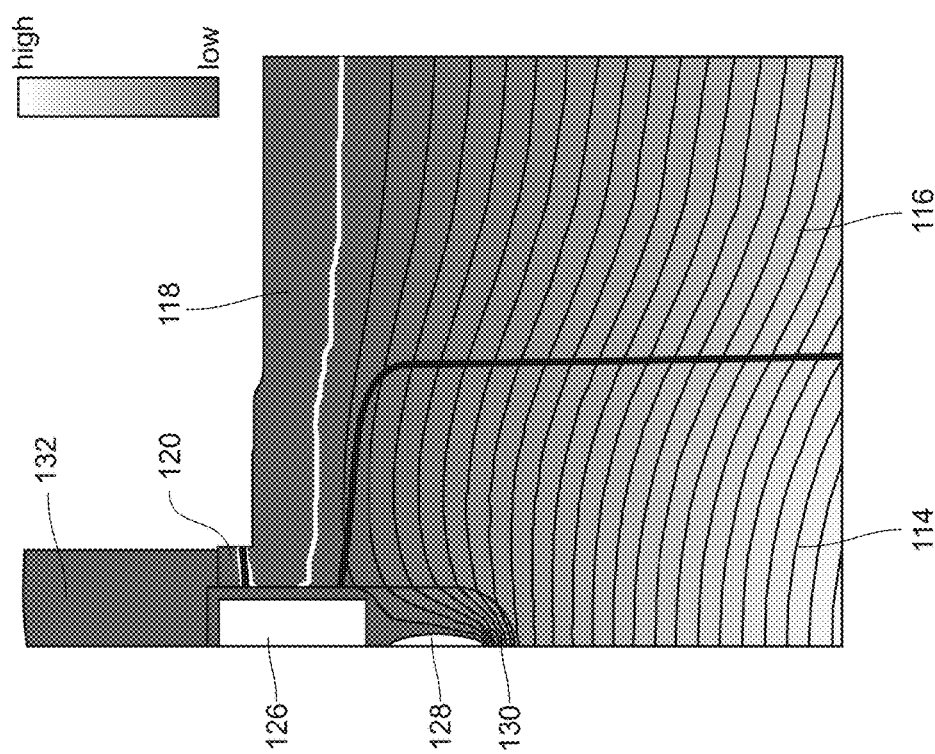

MOSFET AND POWER CONVERSION CIRCUIT

RELATED APPLICATIONS

The present application is a National Phase of International Application Number PCT/JP2016/083610, filed Nov. 11, 2016.

TECHNICAL FIELD

The present invention relates to a Metal-Oxide Semiconductor Field-Effect Transistor (MOSFET) and a power conversion circuit.

BACKGROUND ART

Conventionally, there has been known a MOSFET which includes a semiconductor base substrate where a super junction structure is formed of an n-type column region and a p-type column region (see patent document 1, for example).

As shown in FIG. 10, a conventional MOSFET 800 includes: a semiconductor base substrate 810 having n-type column regions 814, p-type column regions 816, a p-type base region 818 formed on surfaces of the n-type column regions 814 and surfaces of the p-type column regions 816, and an n-type source region 820 formed on a surface of the base region 818 and where a super junction structure is formed of the n-type column regions 814 and the p-type column regions 816; trenches 822 which are formed so as to reach a depth position deeper than a deepest portion of the base region 818 in regions where the n-type column region 814 is positioned as viewed in a plan view and a part of the source region 820 is exposed on an inner peripheral surface of the trench 822; and gate electrodes 826 which are embedded in the inside of the trenches 822 by way of the gate insulation films 824 formed on inner peripheral surfaces of the trenches 822.

In the conventional MOSFET 800, the n-type column region 814 and the p-type column region 816 are formed such that a total amount of a dopant in the n-type column region 814 is equal to a total amount of a dopant in the p-type column region 816. That is, the n-type column region 814 and the p-type column region 816 are well-balanced with each other in terms of a charge.

In this specification, "super junction structure" means a structure where an n-type column region and a p-type column region are alternately and repeatedly arranged as viewed in a predetermined cross section. Further, "total amount of a dopant" means a total amount of a dopant contained in a constitutional element (the n-type column region or the p-type column region) in the MOSFET.

According to the conventional MOSFET 800, the MOSFET includes the semiconductor base substrate 810 where the super junction structure is formed of the n-type column region 814 and the p-type column region 816 and hence, it is possible to provide a switching element having a low ON resistance and a high withstand voltage.

PRIOR ART DOCUMENT

Patent Document

Patent document 1: JP-A-2012-64660
Patent document 2: JP-A-2015-133380

SUMMARY OF INVENTION

Problem to be Solved by the Invention

The conventional MOSFET 800 forms a switching element having low ON resistance and a high withstand voltage as described above, the use of such a MOSFET 800 in a power conversion circuit is considered. However, in the case where the conventional MOSFET 800 is used in a power conversion circuit, it is found that when there is an irregularity in a charge balance around a gate, when the MOSFET is turned off, a large irregularity exists in switching characteristics (see Id (p-type dopant rich) and Id (n-type dopant rich) and Vds (n-type dopant rich) and Vds (p-type dopant rich) in FIG. 3)

The present invention has been made so as to overcome the above-mentioned drawbacks, and it is an object of the present invention to provide a MOSFET and a power conversion circuit which uses the MOSFET where an irregularity in switching characteristics when the MOSFET is turned off can be decreased compared to a prior art even when an irregularity in a charge balance occurs around the gate.

Solution to Problem

[1] According to the present invention, there is provided a MOSFET which includes: a semiconductor base substrate having: an n-type column region and a p-type column region formed in an alternately arranged state; a p-type base region positioned on a surface of the n-type column region and a surface of the p-type column region; and an n-type source region positioned on a surface of the base region, wherein a super junction structure is formed of the n-type column region and the p-type column region; a trench formed in a region where the n-type column region is positioned as viewed in a plan view, and having side walls disposed adjacently to the n-type column region, the base region and the source region and a bottom disposed adjacently to the n-type column region; a gate electrode formed in the trench by way of a gate insulation film; a carrier compensation electrode positioned between the gate electrode and the bottom of the trench; an insulation region disposed in the trench, the insulation region extending between the gate electrode and the carrier compensation electrode, and extending along the side walls and the bottom of the trench thus separating the carrier compensation electrode from the side walls and the bottom; and a source electrode positioned on a surface of the semiconductor base substrate on a first main surface side, the source electrode electrically connected to the source region and also electrically connected to the carrier compensation electrode.

In this specification, "carrier compensation electrode" is an electrode which makes the semiconductor device operate in such a manner that even when an irregularity exists in a charge balance (a balance of a carrier, that is, a balance of dopant concentration, a balance between a width of the p-type column region and a width of the n-type column region or the like) in the n-type column region and the p-type column region, the carrier compensation electrode compensates such an irregularity and reduces an irregularity in a switching characteristics when the MOSFET is turned off.

[2] According to the MOSFET of the present invention, it is preferable that assuming a thickness of the gate electrode from an uppermost portion to a lowermost portion as a and assuming a thickness of the carrier compensation electrode from an uppermost portion to a lowermost portion as b, a relationship of $0.2a \leq b \leq a$ be satisfied.

In this specification, "uppermost portion" is a portion which is closest to (shallowest with respect to) the first main surface of the semiconductor base substrate, and "lowermost portion" is a portion which is remotest from (deepest with respect to) the first main surface of the semiconductor base substrate.

[3] According to the MOSFET of the present invention, it is preferable that the semiconductor base substrate further have a low-resistance semiconductor layer formed on a surface thereof on a second main surface side which is a side opposite to the first main surface, and assuming a thickness of the carrier compensation electrode from an uppermost portion to a lowermost portion as b and assuming a depth from a lowermost portion of the gate electrode to an uppermost portion of the low-resistance semiconductor layer as c, a relationship of $10b \leq c$ be satisfied.

[4] According to the MOSFET of the present invention, it is preferable that dopant concentration in the n-type column region which is a region disposed adjacently to the trench be set to dopant concentration equal to dopant concentration in the n-type column region at a lowermost portion of the n-type column region.

[5] According to the MOSFET of the present invention, it is preferable that dopant concentration in the n-type column region which is a region disposed adjacently to the trench be set lower than dopant concentration in the n-type column region at a lowermost portion of the n-type column region.

[6] According to the MOSFET of the present invention, it is preferable that a thickness of the insulation region between the carrier compensation electrode and the n-type column region be larger than a thickness of the gate insulation film.

[7] According to the present invention, there is provided a power conversion circuit which includes at least: a reactor; a power source which supplies an electric current to the reactor; the MOSFET according to any one of [1] to [6] for controlling an electric current supplied from the power source to the reactor; and a rectifier element which performs a rectifying operation of the electric current supplied from the power source to the reactor or an electric current from the reactor.

[8] According to the power conversion circuit of the present invention, it is preferable that the rectifier element be a fast recovery diode.

[9] According to the power conversion circuit of the present invention, it is preferable that the rectifier element be a built-in diode of the MOSFET.

[10] According to the power conversion circuit of the present invention, it is preferable that the rectifier element be a silicon-carbide Schottky barrier diode.

Advantageous Effects of the Present Invention

The MOSFET and the power conversion circuit of the present invention include: the carrier compensation electrode positioned between the gate electrode and the bottom of the trench and electrically connected with the source electrode; the insulation region extending between the gate electrode and the carrier compensation electrode and extending along the side walls and the bottom of the trench thus separating the carrier compensation electrode from the side walls and the bottom. Accordingly, when the MOSFET is turned off, a displacement current from the drain flows into the source electrode via the carrier compensation electrode and hence, the displacement current minimally flows into the gate electrode. Accordingly, the gate electrode is minimally affected by a change in potential of the n-type column region around the gate. As a result, even when an irregularity exists in a charge balance around the gate, an irregularity in switching characteristics when the MOSFET is turned off can be decreased compared to the prior art.

The MOSFET and the power conversion circuit of the present invention include the carrier compensation electrode and the insulation region having the above-mentioned structures. Accordingly, a distance between the n-type column region (non-depleted n-type column region) and the gate electrode is increased compared to the conventional MOSFET and hence, a feedback capacitance Crss (equal to a gate-drain capacitance Cgd) is made small compared to a conventional MOSFET. Accordingly, the gate electrode is minimally affected by a change in potential of the n-type column region around the gate. As a result, also from this viewpoint, even when an irregularity exists in a charge balance around the gate, an irregularity in switching characteristics when the MOSFET is turned off can be decreased compared to the prior art.

Further, the MOSFET according to the present invention includes the semiconductor base substrate where the super junction structure is formed of the n-type column region and the p-type column region. Accordingly, in the same manner as the prior art, the MOSFET becomes a switching element having a low ON resistance and a high withstand voltage.

Patent document 2 discloses a semiconductor device (another conventional MOSFET 900) which includes: a field plate electrode 942 positioned between a gate electrode 926 and a bottom of a trench 922; and an insulation region 930 disposed in the trench 922 and extending between the gate electrode 926 and the field plate electrode 942, and extending along side walls and the bottom of the trench 922 thus separating the field plate electrode 942 from the side walls and the bottom (see FIG. 11).

However, in the another conventional MOSFET 900, an n-type semiconductor region 944 having higher dopant concentration than other regions of an n$^-$-type column region 914 in an area of the n$^-$-type column region 914 around a gate is formed for reducing an ON resistance. Accordingly, (1) a depletion layer minimally extends in the n-type semiconductor region 944 so that a distance between the non-depleted n-type semiconductor region 944 (or the n$^-$-type column region 914) and the gate electrode 926 hardly becomes long. Accordingly, a feedback capacitance Crss hardly becomes small. Accordingly, the gate electrode 926 is easily affected by a change in potential of the n-type semiconductor region 944 around the gate of the gate electrode 926. Further, (2) in dopant concentration in the n-type semiconductor region 944 around the gate becomes higher than dopant concentration in the p$^-$-type column region 916 (n-type dopant locally becoming rich) and hence, an irregularity in switching characteristics during a turn-off period is liable to be increased (see Id (n-type dopant rich) and Vds (n-type dopant rich) in FIG. 3).

Accordingly, another conventional MOSFET 900 cannot acquire an advantageous effect that even when an irregularity exists in a charge balance around the gate, an irregularity in switching characteristics when the MOSFET 900 is turned off can be made small compared to a prior art.

Accordingly, the field plate electrode 942 of another conventional MOSFET 900 cannot compensate an irregularity in a charge balance around the gate when such an irregularity exists and hence, the MOSFET 900 cannot operate a semiconductor device such that an irregularity in switching characteristics when the semiconductor device is turned off is made small. Accordingly, the field plate electrode 942 of another conventional MOSFET 900 differs from the carrier compensation electrode of the present invention.

BRIEF DESCRIPTION OF DRAWINGS

In FIG. 3, "p-type dopant rich" means a case where a total amount of a dopant in a p-type column region is 10% larger than a total amount of a dopant in an n-type column region, "n-type dopant rich" means a case where a total amount of a dopant in a n-type column region is 10% larger than a total amount of a dopant in a p-type column region, and "Just" means a case where a total amount of a dopant in a p-type column region and a total amount of a dopant in an n-type column region are equal (the same definition being applicable to FIG. 4). Further, a power source voltage is 300V (the same definition being applicable to FIG. 4).

FIG. 5A is the cross-sectional view showing the MOSFET 100A according to the present invention example, and FIG. 5B is the cross-sectional view showing the MOSFET 700 according to the Comparative example 2. FIG. 5A and FIG. 5B are schematic views and do not strictly reflect sizes and shapes of the structures used in a simulation result shown in FIG. 6A and FIG. 6B.

FIG. 6A and FIG. 6B are views showing a simulation result of equal potential lines when the MOSFET is turned off in the MOSFET 100A according to the present invention example and the MOSFET 700 according to the Comparative example 2. FIG. 6A is a view showing the simulation result of equal potential lines when the MOSFET is turned off in the MOSFET 100A according to the present invention example. FIG. 6B is a view showing the simulation result of equal potential lines when the MOSFET is turned off in the MOSFET 700 according to the Comparative example 2. FIG. 6A is a view corresponding to a region surrounded by a chain line shown in FIG. 5A, and FIG. 6B is a view corresponding to a region surrounded by a chain line shown in FIG. 5B. In FIG. 6A and FIG. 6B, a bold black solid line indicates a boundary between an n-type column region and a p-type column region, a black fine solid line indicates equal potential lines drawn at an interval of 3V, and a white solid line indicates a boundary between a region where carriers become 5% at a normal time and remaining other regions.

DESCRIPTION OF EMBODIMENTS

Figure 1:
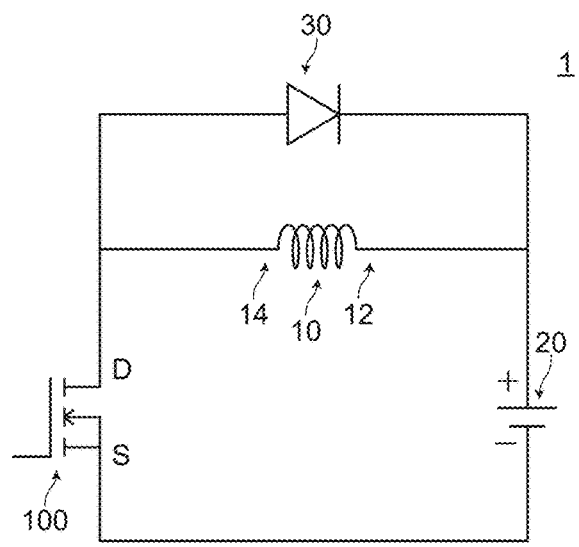
FIG. 1 is a circuit diagram showing a power conversion circuit 1 according to Embodiment 1.

Hereinafter, a MOSFET and a power conversion circuit according to the present invention are described in accordance with Embodiments shown in the drawings. The respective drawings are schematic drawings, and do not always strictly reflect actual sizes of the MOSFET and the power conversion circuit.

Embodiment 1

1. Structure and operation of power conversion circuit 1 according to Embodiment 1

A power conversion circuit 1 according to Embodiment 1 is a chopper circuit which is a constitutional element such as a DC-DC converter or an inverter. The power conversion circuit 1 according to Embodiment 1 includes, as shown in FIG. 1, a reactor 10, a power source 20, a MOSFET 100 according to Embodiment 1, and a rectifier element 30.

The reactor 10 is a passive element which can store energy in a magnetic field generated by an electric current which flows through the reactor 10.

The power source 20 is a DC power source which supplies an electric current to the reactor 10. The MOSFET 100 controls an electric current supplied from the power source 20 to the reactor 10. To be more specific, the MOSFET 100 is switched to assume an ON state in response to a clock signal applied from a drive circuit (not shown in the drawing) to a gate electrode of the MOSFET 100, and makes the reactor 10 and a negative pole of the power source 20 electrically conductive with each other. The specific structure of the MOSFET 100 is described later.

The rectifier element 30 is a fast recovery diode which performs a rectifying operation of an electric current supplied from the power source 20 to the reactor 10. To be more specific, the rectifier element 30 is a lifetime-controlled PIN diode.

A positive pole (+) of the power source 20 is electrically connected to one end 12 of the reactor 10 and a cathode electrode of the rectifier element 30, and a negative pole (−) of the power source 20 is electrically connected to a source electrode of the MOSFET 100. A drain electrode of the MOSFET 100 is electrically connected to the other end 14 of the reactor 10 and an anode electrode of the rectifier element 30.

In such a power conversion circuit 1, when the MOSFET 100 is in an ON state, an electric current path from the positive pole (+) of the power source 20 to the negative pole (−) of the power source 20 through the reactor 10 and the MOSFET 100 is formed, and an electric current flows through the electric current path. In this case, electric energy of the power source 20 is stored in the reactor 10.

When the MOSFET 100 is turned off, an electric current which flows through the electric current path from the positive pole (+) of the power source 20 to the negative pole (−) of the power source 20 through the reactor 10 and the MOSFET 100 is decreased and becomes 0 soon. On the other hand, the reactor 10 generates an electromotive force in a direction in which a change in an electric current is obstructed (electric energy stored in the reactor 10 is discharged) due to a self induction effect. An electric current generated due to an electromotive force of the reactor 10 flows to the rectifier element 30, and a forward electric current flows in the rectifier element 30.

A sum of an amount of an electric current which flows through the MOSFET 100 and an amount of an electric current which flows through the rectifier element 30 is equal to an amount of an electric current which flows through the reactor 10. A switching period of the MOSFET 100 is short (possibly 100 nsec at maximum) and hence, an amount of an electric current which flows through the reactor 10 minimally changes during such a period. Accordingly, a sum of an amount of an electric current which flows through the MOSFET 100 and an amount of an electric current which flows through the rectifier element 30 minimally changes in either one of cases, that is, an ON state, a turn-off period or an OFF state.

In such a power conversion circuit 1, a case is considered where a conventional MOSFET 800 is used as the MOSFET. In this case, when an irregularity exists in a charge balance around the gate, there arises a drawback that an irregularity in switching characteristics when the power conversion circuit 1 is turned off is increased (see FIG. 3).

Accordingly, in the present invention, as the MOSFET, the MOSFET 100 according to Embodiment 1 having the following structure is used.

2. Structure of MOSFET 100 According to Embodiment 1

Figure 2:
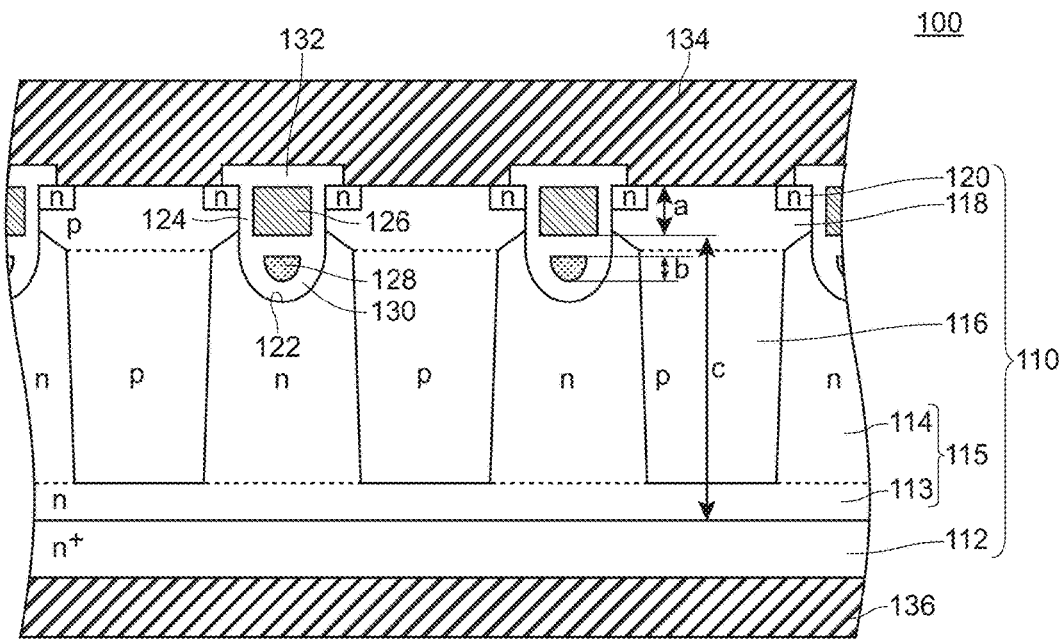
FIG. 2 is a cross-sectional view of a MOSFET 100 according to Embodiment 1.

As shown in FIG. 2, the MOSFET 100 according to Embodiment 1 is a trench-gate-type MOSFET which includes a semiconductor base substrate 110, a trench 122, a gate electrode 126, a carrier compensation electrode 128, an insulation region 130, an interlayer insulation film 132, a source electrode 134, and a drain electrode 136. A drain-source withstand voltage of the MOSFET 100 is 300V or more, for example, 600V.

The semiconductor base substrate 110 has an n-type low-resistance semiconductor layer 112 formed on a surface of the semiconductor base substrate 110 on the second main surface side which is a side opposite to the first main surface of the semiconductor base substrate 110, an n-type buffer layer 113 formed on the low-resistance semiconductor layer 112 and having a lower dopant concentration than dopant concentration in the low-resistance semiconductor layer 112, n-type column regions 114 and p-type column regions 116 formed on the buffer layer 113 where the n-type column region 114 and the p-type column region 116 are alternately arranged along a horizontal direction, a p-type base region 118 formed on surfaces of the n-type column regions 114 and surfaces of the p-type column regions 116, and n-type source regions 120 formed on a surface of the base region 118, wherein a super junction structure is formed of the n-type column region 114 and the p-type column regions 116. The buffer layer 113 and the n-type column regions 114 are integrally formed with each other, and the buffer layer 113 and the n-type column region 114 form an n-type semiconductor layer 115.

Although a total amount of a dopant in the n-type column region 114 is set equal to a total amount of a dopant in the p-type column region 116, a total amount of a dopant in the n-type column region 114 may be set smaller than a total amount of a dopant in the p-type column region 116 or a total amount of a dopant in the n-type column region 114 may be set larger than a total amount of a dopant in the p-type column region 116.

In both the n-type column region 114 and the p-type column region 116, the dopant concentration is set to a fixed value regardless of depth. That is, the dopant concentration in the n-type column region 114 in a region disposed adjacently to the trench 122 is equal to the dopant concentration of the n-type column region 114 in a lowermost portion of the n-type column region 114, and the dopant concentration in the p-type column region 116 in a region disposed adjacently to the base region 118 is equal to the dopant concentration of the p-type column region 116 in a lowermost portion of the p-type column region 116. In the p-type column region 116, a width of the p-type column region 116 is gradually increased from the second main surface side to the first main surface. On the other hand, in the n-type column region 114, a width of the n-type column region 114 is gradually narrowed from the second main surface side to the first main surface.

All of the n-type column regions 114, the p-type column regions 116, the source regions 120, the trenches 122 and the gate electrodes 126 are formed in a stripe shape as viewed in a plan view.

A thickness of the low-resistance semiconductor layer 112 falls within a range of 100 μm to 400 μm, for example, and dopant concentration in the low-resistance semiconductor layer 112 falls within a range of $1\times10^{19}$ cm$^{-3}$ to $1\times10^{20}$Cm$^{-3}$, for example. A thickness of the n-type semiconductor layer 115 falls within a range of 5 μm to 120 μm, for example. Dopant concentration in the n-type semiconductor layer 115 falls within a range of $5\times10^{13}$ cm$^{-3}$ to $1\times10^{16}$ cm$^{-3}$, for example. Dopant concentration of the p-type column region 116 falls within a range of $5\times10^{13}$ cm$^{-3}$ to $1\times10^{16}$ cm$^{-3}$, for example. A depth position of a lowermost portion of the base region 118 falls within a range of 0.5 μm to 4.0 μm, for example, and dopant concentration in the base region 118 falls within a range of $5\times10^{16}$ cm$^{-3}$ to $1\times10^{18}$ cm$^{-3}$, for example. A depth position of a deepest portion of the source region 120 falls within a range of 0. μm to 0.41 μm, for example, and dopant concentration in the source region 120 falls within a range of $5\times10^{19}$ cm$^{-3}$ to $2\times10^{20}$Cm$^{-3}$, for example.

The trench 122 is formed in a region where the n-type column region 114 is positioned as viewed in a plan view, and has side walls disposed adjacently to the n-type column region 114, the base region 118 and the source region 120 and a bottom disposed adjacently to the n-type column region 114. A depth of the trench 122 is set to a value which falls within a range of 2.0 μm to 8.01 μm, for example, 5 μm.

The gate electrode 126 is formed in the trench 122 by way of a gate insulation film 124. To be more specific, the gate electrode 126 is formed in the trench 122 such that the gate electrode 126 opposedly faces the base region 118 by way of the gate insulation films 124 formed on side walls of the trench 122. The gate insulation film 124 is formed of a silicon dioxide film formed by a thermal oxidation method and the gate insulation film 124 has a thickness of 100 nm, for example. The gate electrode 126 is formed by a CVD method and an ion implantation method and is made of low-resistance polysilicon.

The carrier compensation electrode 128 is positioned between the gate electrode 126 and the bottom of the trench 122. A width of the carrier compensation electrode 128 is set smaller than a width of the gate electrode 126.

The insulation region 130 extends, in the inside of the trench 122, between the gate electrode 126 and the carrier compensation electrode 128 and extends along the side walls and the bottom of the trench 122 thus separating the carrier compensation electrode 128 from the side walls and the bottom of the trench 122. A thickness of the insulation region 130 between the carrier compensation electrode 128 and the n-type column region 114 is set larger than a thickness of the gate insulation film 124.

The interlayer insulation film 132 is formed so as to cover a portion of the source region 120, the gate insulation film 124 and the gate electrode 126. The interlayer insulation film 132 is formed by a CVD method and is formed of a PSG film having a thickness of 1000 nm, for example.

The source electrode 134 is formed on a surface of the semiconductor base substrate 110 on a first main surface side at positions where the source electrode 134 covers the base region 118, portions of the source region 120 and the interlayer insulation films 132. The source electrode 134 is electrically connected with the source regions 120, and is also electrically connected with the carrier compensation electrodes 128. The source electrode 134 is made of aluminum-based metal (Al—Cu-based alloy, for example) having a thickness of 4 μm formed by a sputtering method, for example.

The drain electrode 136 is formed on a surface of the low-resistance semiconductor layer 112. The drain electrode 136 is formed of a multi-layered metal film such as a Ti—Ni—Au film. A total thickness of the multi-layered metal film is 0.5 μm, for example.

In the MOSFET 100 according to Embodiment 1, assuming a thickness of the gate electrode 126 from an uppermost portion to a lowermost portion as "a" and assuming a thickness of the carrier compensation electrode 128 from an uppermost portion to a lowermost portion as "b", a relationship of $0.2a \leq b \leq a$ is satisfied.

In the MOSFET 100 according to Embodiment 1, assuming a thickness of the carrier compensation electrode 128 from an uppermost portion to a lowermost portion as "b" and assuming a depth from a lowermost portion of the gate electrode 126 to an uppermost portion of the low-resistance semiconductor layer 112 as "c", a relationship of $10b \leq c$ is satisfied.

3. Waveform and Manner of Operation of MOSFET 100 when MOSFET 100 is Turned Off To describe the MOSFET according to Embodiment 1, a MOSFET according to Comparative example 1 is described first. The MOSFET according to Comparative example 1 basically has the structure which is substantially same to the structure of the conventional MOSFET 800.

In the power conversion circuit 1 according to Embodiment 1, in the case where the MOSFET according to Comparative example 1 is used in place of the MOSFET 100, the MOSFET according to Comparative example 1 is operated as follows.

(1) Drain Current Id

In the case where a total amount of a dopant in the n-type column region and a total amount of a dopant in the p-type column region are equal (hereinafter referred to as "in the case of Just"), the MOSFET is operated such that, during a period from a point of time that a drain current Id starts to be decreased to a point of time that the drain current Id becomes 0 for the first time, a period where the drain current Id is temporarily increased slightly appears (the MOSFET being operated such that a hump waveform slightly appears in a waveform of the drain current Id) (see Id (Just) in FIG. 3). The period from a point of time that a drain current Id starts to be decreased to a point of time that the drain current Id becomes 0 for the first time is approximately 0.02 μsec (20 nsec).

In the case where an irregularity exists in a charge balance such that a total amount of a dopant in the n-type column region is larger than a total amount of a dopant in the p-type column region (hereinafter referred to as "in the case of n-type dopant rich), the MOSFET is operated such that, during a period from a point of time that a drain current Id starts to be decreased to a point of time that the drain current Id becomes 0 for the first time, a period where the drain current Id is temporarily increased appears (the MOSFET being operated such that a large hump waveform appears in a waveform of the drain current Id) (see Id(n-type dopant rich) in FIG. 3). With respect to the hump waveform, the drain current Id is increased to a current value higher than a current value in the case of Just and, at the same time, a period until the drain current Id becomes 0 is largely prolonged compared to the case of Just (approximately 0.02 μsec (20 nsec) in case of Just and approximately 0.04 μsec (40 nsec) in case of n-type dopant rich).

In the case where a total amount of a dopant in the p-type column region is larger than a total amount of a dopant in the n-type column region (hereinafter referred to as "in the case of p-type dopant rich"), the MOSFET is operated such that the drain current Id is monotonously decreased (the MOSFET being operated such that no hump waveform appears in a waveform of the drain current Id) see Id (p-type dopant rich) in FIG. 3)

(2) Drain-Source Voltage Vds

In the case of n-type dopant rich, the MOSFET is operated such that a drain-source voltage Vds is increased to approximately 350V more gently compared to the case of Just and, thereafter, the drain-source voltage Vds is gradually decreased and becomes stable at a power source voltage (300V). A time until a drain-source voltage Vds becomes stable from a point of time that the drain-source voltage Vds starts to be increased is longer than that of the case of Just and is approximately 0.05 μsec (50 nsec) (see Vds (n-type dopant rich) in FIG. 3).

Figure 3:
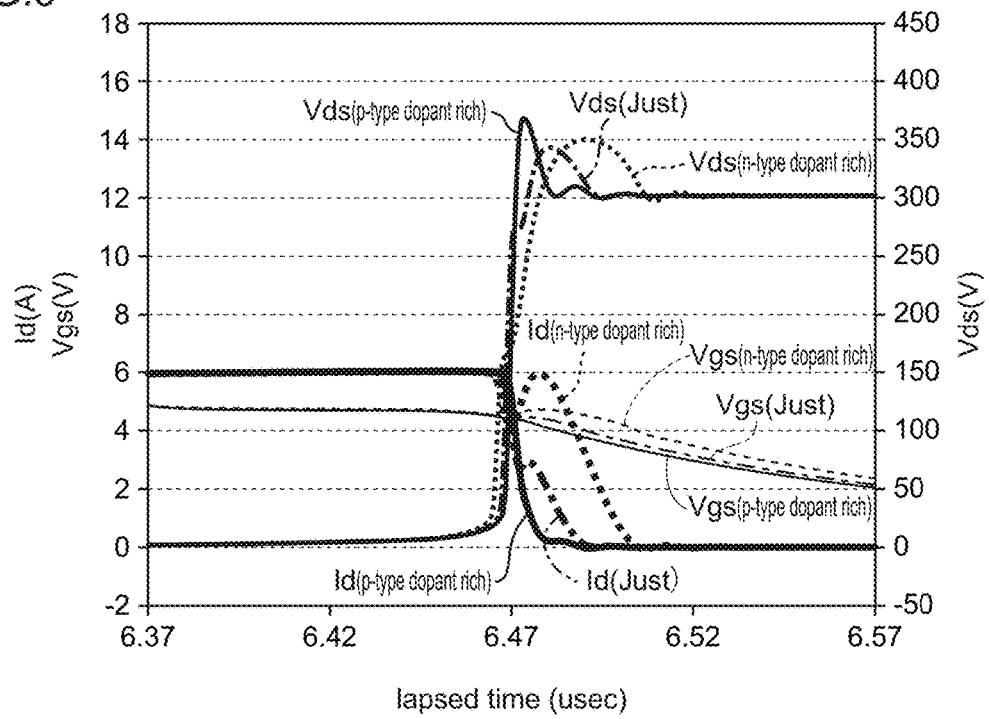
FIG. 3 is a graph showing a result of time transition simulation of a drain-source voltage Vds, a drain current Id and a gate-source voltage Vgs when a MOSFET according to a Comparative example 1 is turned off in a power conversion circuit using the MOSFET.

In the case of p-type dopant rich, the MOSFET is operated such that a drain-source voltage Vds is increased to approximately 370V more steeply compared to the case of Just and, thereafter, becomes stable at a power source voltage (300V) (see Vds (p-type dopant rich) in FIG. 3). A time until a drain-source voltage Vds becomes stable from a point of time that the drain-source voltage Vds starts to be increased is approximately 0.02 μsec (20 nsec).

(3) Gate-Source Voltage Vgs

In the case of n-type dopant rich, the MOSFET is operated such that a period during which a gate-source voltage Vgs is temporarily increased slightly appears after completion of a mirror period (see Vgs (n-type dopant rich) in FIG. 3). On the other hand, in case of Just and in the case of p-type dopant rich, the MOSFET is operated such that a gate-source voltage Vgs minimally changes and is monotonously decreased (Vgs (p-type dopant rich) and Vgs (Just) in FIG. 3).

As can be understood from the above-mentioned (1) to (3), in the MOSFET according to the Comparative example 1, when an irregularity exists in a charge balance around the gate (Just being changed to n-type dopant rich or p-type dopant rich), an irregularity in switching characteristics when the MOSFET is turned off, particularly an irregularity in a drain current Id and a drain-source voltage Vds is increased. When an irregularity in a charge balance exists in n-type dopant rich, an irregularity in switching characteristics is particularly increased.

On the other hand, in the power conversion circuit 1 according to the Embodiment 1, the MOSFET according to the Embodiment 1 is operated as follows.

(1) Drain Current Id

In all cases, that is, in case of Just, in case of n-type dopant rich and in case of p-type dopant rich, a turn-off period becomes short. Further, in all cases, the MOSFET is operated such that the drain current Id adopts a similar waveform (see respective Id in FIG. 4). Particularly, in case of n-type dopant rich, a hump waveform which appears in a waveform of the drain current Id becomes small and hence, the MOSFET is operated such that the waveform of the drain current Id becomes similar to a waveform of the drain current Id in case of Just and the drain current Id in case of p-type dopant rich.

(2) Drain-Source Voltage Vds

In all cases, that is, in case of Just, in case of n-type dopant rich and in case of p-type dopant rich, a turn-off period becomes short (approximately 0.03 μsec (30 nsec) or less). Further, in all cases, the MOSFET is operated such that the drain-source voltage Vds adopts a similar waveform (see respective Vds in FIG. 4). Although ringing occurs in case of p-type dopant rich, ringing can be made small by including a mechanism to remove ringing such as a snubber circuit.

(3) Gate-Source Voltage Vgs

Figure 4:
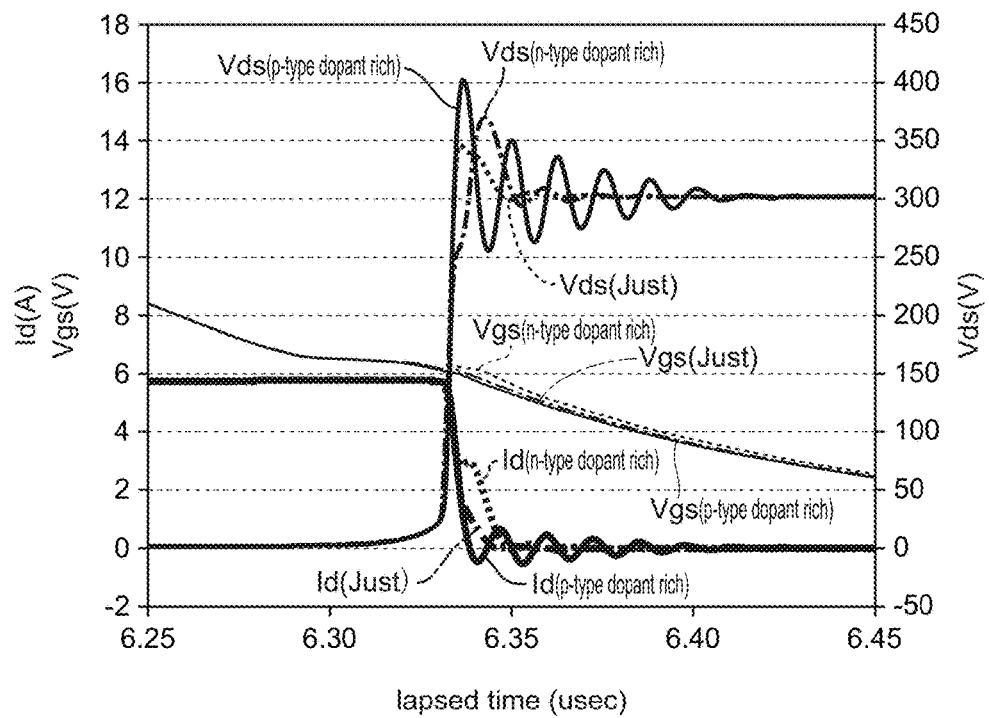
FIG. 4 is a graph showing a result of time transition simulation of a drain-source voltage Vds, a drain current Id and a gate-source voltage Vgs when a MOSFET according to the Embodiment 1 is turned off in a power conversion circuit 1 according to the Embodiment 1.

In all cases, that is, in case of Just, in case of n-type dopant rich and in case of p-type dopant rich, the MOSFET is operated such that there is substantially no difference in the gate-source voltage Vgs between these cases (see respective Vgs in FIG. 4). In the MOSFET 100 according to Embodiment 1, a mirror period is made short compared to the MOSFET according to Comparative example 1.

As can be understood from the above-mentioned (1) to (3), in the MOSFET 100 according to Embodiment 1, even when an irregularity in a charge balance exists around the gate (case of Just being changed to case of n-type dopant rich, case of Just being changed to case of p-type dopant rich or the like), an irregularity in switching characteristics when the MOSFET is turned off can be made small compared to the prior art.

Figure 5A:
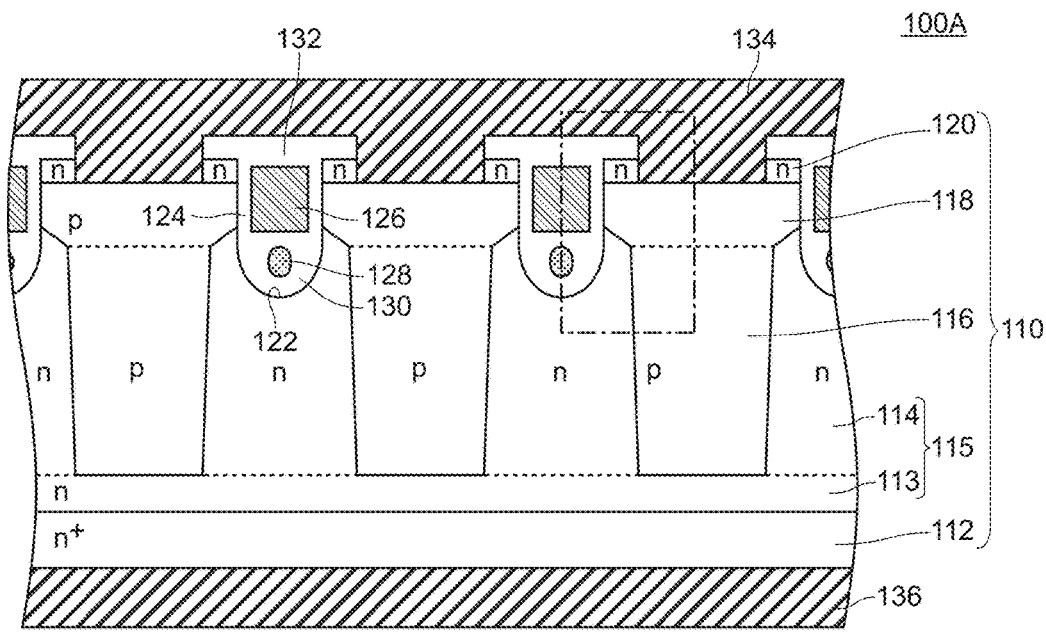
FIGS. 5A and 5B are cross-sectional views of the MOSFET 100A according to the present invention example and the MOSFET 700 according to a Comparative example 2.
Figure 5B:
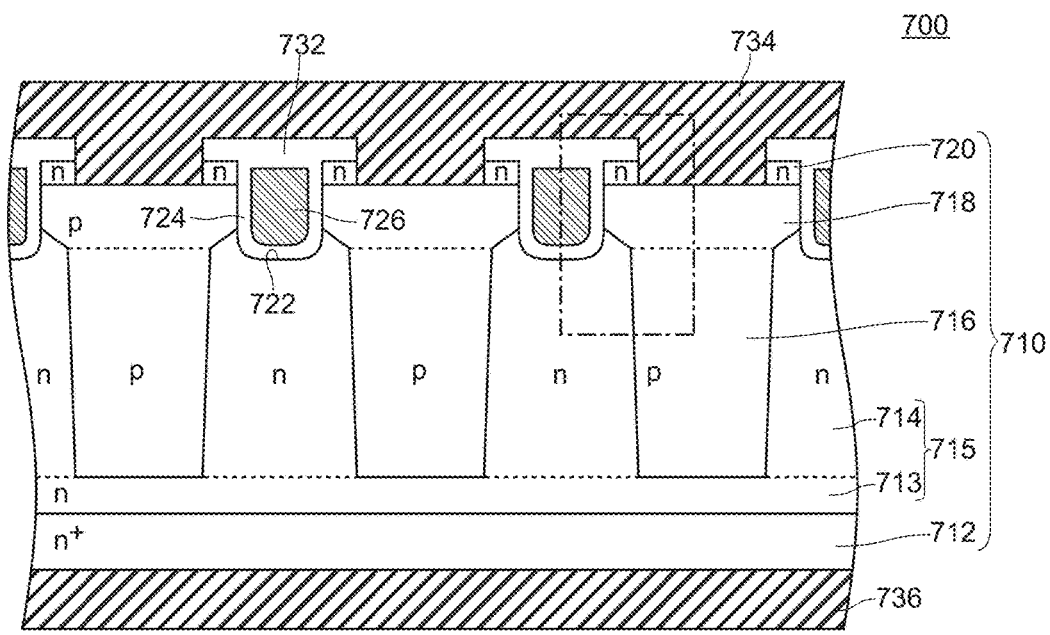

Next, the manner of operation of the MOSFET when the MOSFET is turned off is described from a viewpoint of potential. A MOSFET 100A according to the present invention example is a MOSFET having substantially the same structure as the MOSFET 100 according to Embodiment 1 except for a point that a portion which is brought into contact with the source electrode is dug to an area near a lowermost portion of the source region (see FIG. 5A). A MOSFET 700 according to Comparison example 2 is a MOSFET having substantially the same structure as the conventional MOSFET 800 except for a point that a portion which is brought into contact with the source electrode is dug to an area near a lowermost portion of the source region (see FIG. 5B).

In the MOSFET 700 according to Comparative example 2, when the MOSFET is turned off, equipotential lines enter also an insulation film interposed between a gate electrode 726 and an n-type column region 714 so that a state where a potential is high reaches an area near the gate electrode 726 whereby a state is brought about where a potential of the gate electrode 726 is liable to become high (see FIG. 6B). Accordingly, when an irregularity in a charge balance exists around the gate, an irregularity in switching characteristics when the MOSFET is turned off is liable to occur.

On the other hand, in the MOSFET 100A according to the present invention example, although equipotential lines also enter the insulation region 130 interposed between the carrier compensation electrode 128 and the n-type column region 114, the equipotential lines are remote from the gate electrode 126 and the carrier compensation electrode 128 is positioned between the equipotential lines which enter the insulation region 130 and the gate electrode 126. Accordingly, a state is brought about where a potential of the gate electrode 126 minimally becomes high (see FIG. 6A). Accordingly, even in the case where an irregularity in a charge balance exists around the gate, an irregularity minimally occurs in switching characteristics when the MOSFET is turned off.

4. Advantageous Effect Acquired by MOSFET 100 and Power Conversion Circuit 1 According to Embodiment 1

The MOSFET 100 and the power conversion circuit 1 according to Embodiment 1 include: the carrier compensation electrode 128 positioned between the gate electrode 126 and the bottom of the trench 122 and electrically connected with the source electrode 134; and the insulation region 130 disposed in the trench 122, the insulation region 130 extending between the gate electrode 126 and the carrier compensation electrode 128 and extending along the side walls and the bottom of the trench 122 thus separating the carrier compensation electrode 128 from the side walls and the bottom in the trench 22. Accordingly, when the MOSFET 100 is turned off, a displacement current from the drain electrode flows into the source electrode 134 via the carrier compensation electrode 128 and hence, the displacement current minimally flows into the gate electrode 126. Accordingly, the gate electrode 126 is minimally affected by a change in potential of the n-type column region 114 around the gate. As a result, even when an irregularity exists in a charge balance around the gate, an irregularity in a switching characteristic when the MOSFET 100 is turned off can be decreased compared to the prior art.

The MOSFET 100 and the power conversion circuit 1 according to Embodiment 1 include: the carrier compensation electrode 128 and the insulation region 130 having the above-mentioned structures. Accordingly, a distance between the n-type column region 114 (non-depleted n-type column region) and the gate electrode 126 is increased compared to that of the conventional MOSFET 800 and hence, a feedback capacitance Crss is made small compared to that of the conventional MOSFET 800. Accordingly, the gate electrode 126 is minimally affected by a change in potential of the n-type column region 114 around the gate. As a result, also from this viewpoint, even when an irregularity exists in a charge balance around the gate, an irregularity in a switching characteristic when the MOSFET is turned off can be decreased compared to the prior art.

The MOSFET 100 according to Embodiment 1 includes the semiconductor base substrate 110 where the super junction structure is formed of the n-type column region 114 and the p-type column region 116. Accordingly, in the same manner as the prior art, the MOSFET 100 becomes a switching element having a low ON resistance and a high withstand voltage.

In the MOSFET 100 according to Embodiment 1, assuming a thickness of the gate electrode 126 from an uppermost portion to a lowermost portion as a and assuming a thickness of the carrier compensation electrode 128 from an uppermost portion to a lowermost portion as b, a relationship of $0.2a \leq b \leq a$ is satisfied. Accordingly, it is unnecessary to form a deep trench for forming the carrier compensation electrode 128 and hence, it is possible to provide the MOSFET 100 which can satisfy a demand for reduction of cost and downsizing of electronic equipment.

In the MOSFET 100 according to this Embodiment 1, assuming a thickness of the carrier compensation electrode 128 from an uppermost portion to a lowermost portion as b and assuming a depth from a lowermost portion of the gate electrode 126 to an uppermost portion of the low-resistance semiconductor layer 112 as c, a relationship of 10b≤c is satisfied. Accordingly, it is possible to provide a MOSFET having a high withstand voltage. Also in such a MOSFET having a high withstand voltage, even when an irregularity exists in a charge balance around the gate, an irregularity in a switching characteristic when the MOSFET 100 is turned off can be decreased compared to the prior art.

In the MOSFET 100 according to this Embodiment 1, assuming a thickness of the carrier compensation electrode 128 from an uppermost portion to a lowermost portion as b and assuming a depth from a lowermost portion of the gate electrode 126 to an uppermost portion of the low-resistance semiconductor layer 112 as c, a relationship of 10b≤c is satisfied. Accordingly, the gate electrode 126 is positioned relatively remote from the drain electrode 136 and hence, a potential of the n-type column region 114 around the gate is minimally increased. As a result, even in the case where an irregularity exists in a charge balance around the gate, an irregularity in a switching characteristic when the MOSFET 100 is turned off can be made further small.

According to the MOSFET 100 of Embodiment 1, dopant concentration in the n-type column region 114 which is a region disposed adjacently to the trench 122 is set equal to dopant concentration in the n-type column region 114 at a lowermost portion of the n-type column region 114. Accordingly, in a manufacturing process of the semiconductor device, it is possible to easily form the n-type column region 114 without changing concentration at the time of implanting a dopant.

According to the MOSFET 100 of Embodiment 1, a thickness of the insulation region 130 between the carrier compensation electrode 128 and the n-type column region 114 is larger than a thickness of the gate insulation film 124. Accordingly, it is possible to make the gate electrode 126 function as a MOSFET and, at the same time, it is possible to ensure a sufficient withstand voltage between the carrier compensation electrode 128 which is at a source potential and the n-type column region 114 which is at a potential near a drain potential.

According to the power conversion circuit 1 of Embodiment 1, the rectifier element 30 is a fast recovery diode and hence, it is possible to make a loss caused by a reverse recovery current at the time of turning on the MOSFET 100 small.

Embodiment 2

Figure 7:
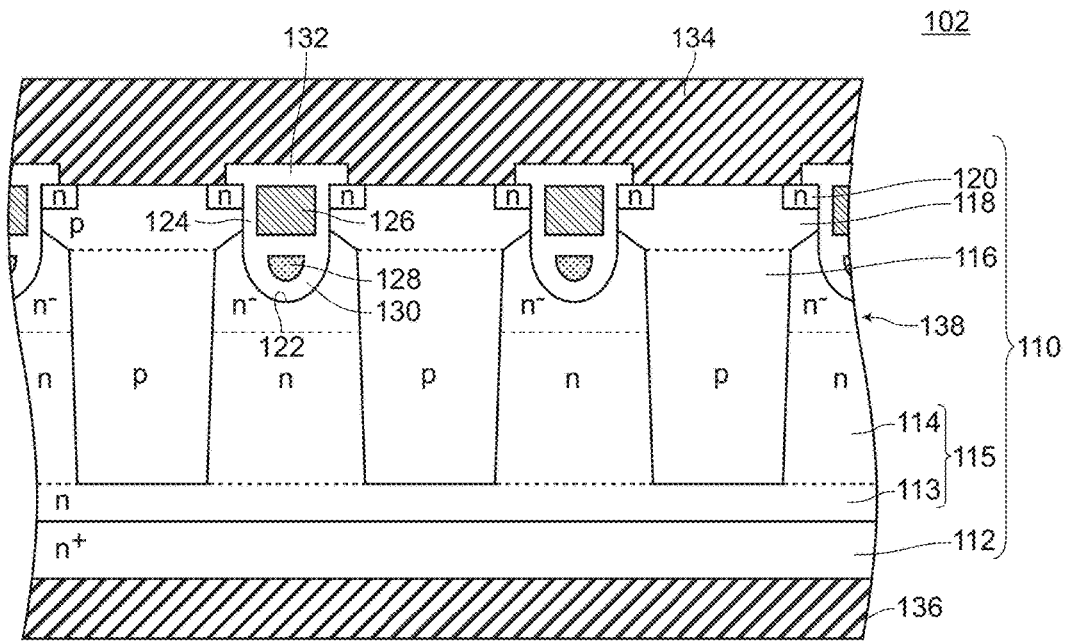
FIG. 7 is a cross-sectional view showing a MOSFET 102 according to Embodiment 2.

MOSFET 102 according to Embodiment 2 basically has substantially the same structure as MOSFET 101 according to Embodiment 1. However, MOSFET 102 according to Embodiment 2 differs from MOSFET 101 according to Embodiment 1 with respect to a point that dopant concentration in an n-type column region disposed in a region adjacently to a trench is lower than dopant concentration in the n-type column region at a lowermost portion of the n-type column region. That is, in a semiconductor base substrate 110 of MOSFET 102 according to Embodiment 2, an n-type column region 114 has a region (n⁻-type semiconductor region 138) having dopant concentration lower than dopant concentration in a lowermost portion of the n-type column region 114 in the region disposed adjacently to a trench 122 as shown in FIG. 7.

In Embodiment 2, the n-type column region 114 may have a region where dopant concentration is lower than dopant concentration in the lowermost portion of the n-type column region 114 only in the region disposed adjacently to the trench 122, or may have the region where dopant concentration is lower than dopant concentration in the lowermost portion of the n-type column region 114 in regions other than the region disposed adjacently to the trench 122 (for example, the n-type column region 114 being formed such that dopant concentration is gradually decreased in a direction toward a first main surface side (source electrode 134 side).

In this manner, MOSFET 102 according to Embodiment 2 differs from MOSFET 100 according to Embodiment 1 with respect to the point that dopant concentration in the n-type column region disposed in the region adjacently to the trench is lower than dopant concentration in the n-type column region at the lowermost portion of the n-type column region. However, in the same manner as MOSFET 100 according to Embodiment 1, MOSFET 102 according to Embodiment 2 includes: a carrier compensation electrode 128 positioned between a gate electrode 126 and a bottom of the trench 122 and electrically connected with a source electrode 134; and an insulation region 130 disposed in the trench 122, the insulation region 130 extending between the gate electrode 126 and the carrier compensation electrode 128 and extending along side walls and the bottom of the trench 122 thus separating the carrier compensation electrode 128 from the side walls and the bottom. Accordingly, when the MOSFET 102 is turned off, a displacement current from the drain flows into a source electrode 134 via the carrier compensation electrode 128 and hence, the displacement current minimally flows into the gate electrode 126. Accordingly, the gate electrode 126 is minimally affected by a change in potential of the n-type column region 114 around the gate. As a result, even when an irregularity exists in a charge balance around the gate, an irregularity in switching characteristics when the MOSFET 102 is turned off can be decreased compared to the prior art.

Further, in the MOSFET 102 according to Embodiment 2, dopant concentration in the n-type column region 114 disposed in the region adjacently to the trench 122 is lower than dopant concentration in the n-type column region 114 at the lowermost portion of the n-type column region 114. Accordingly, the n-type column region 114 around the gate is more easily depleted and hence, a distance between the n-type column region 114 (non-depleted n-type column region) and the gate electrode 126 becomes further longer whereby a feedback capacitance Crss is further decreased whereby the gate electrode 126 is more minimally affected by a change in potential in the n-type column region 114 around the gate. As a result, even when an irregularity exists in a charge balance around the gate, an irregularity in switching characteristics when the MOSFET 100 is turned off can be made further small compared to the prior art.

The MOSFET 102 according to Embodiment 2 has substantially the same structure as the MOSFET 100 according to Embodiment 1 except for the point that dopant concentration in the n-type column region disposed in the region disposed adjacently to the trench is lower than dopant concentration in the n-type column region at the lowermost portion of the n-type column region. Accordingly, the MOSFET 102 according to Embodiment 2 can acquire the advantageous effects by the constitutional parts corresponding to the corresponding constitutional parts of the MOSFET 102 according to Embodiment 2 among the advantageous effects acquired by the MOSFET 100 according to Embodiment 1.

Embodiment 3

Figure 8:
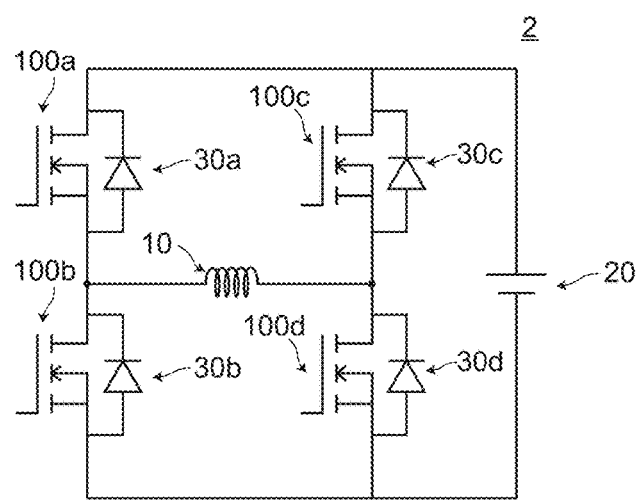
FIG. 8 is a circuit diagram showing a power conversion circuit 2 according to Embodiment 3.

A power conversion circuit 2 according to Embodiment 3 basically has substantially the same structure as the power conversion circuit 1 according to Embodiment 1. However, the power conversion circuit 2 according to Embodiment 3 differs from the power conversion circuit 1 according to Embodiment 1 with respect to a point that the power conversion circuit is a full bridge circuit. That is, the power conversion circuit 2 according to Embodiment 3 includes, as shown in FIG. 8, four MOSFETs 100 (100*a* to 100*d*) as the MOSFETs, and also includes built-in diodes of the respective MOSFETs as rectifying elements.

In this manner, the power conversion circuit 2 according to Embodiment 3 differs from the power conversion circuit 1 according to Embodiment 1 with respect to a point that the power conversion circuit 2 is a full bridge circuit. However, in the same manner as the power conversion circuit 1 according to Embodiment 1, the MOSFETs 100 (100*a* to 100*d*) respectively include: a carrier compensation electrode 128 positioned between a gate electrode 126 and a bottom of a trench 122 and electrically connected with a source electrode 134; and an insulation region 130 disposed in the trench 122, the insulation region 130 extending between the gate electrode 126 and the carrier compensation electrode 128 and extending along the side walls and the bottom of the trench 122 thus separating the carrier compensation electrode 128 from the side walls and the bottom. Accordingly, when the MOSFET 100 is turned off, a displacement current from a drain flows into the source electrode 134 via the carrier compensation electrode 128 and hence, the displacement current minimally flows into the gate electrode 126. Accordingly, the gate electrode 126 is minimally affected by a change in potential of the n-type column region 114 around the gate. As a result, even when an irregularity exists in a charge balance around the gate, an irregularity in switching characteristics when the MOSFET 100 is turned off can be decreased compared to the prior art.

Further, according to the power conversion circuit 2 of Embodiment 3, a rectifier element is the built-in diode in the MOSFET and hence, it is unnecessary to additionally prepare a rectifier element.

The power conversion circuit 2 of Embodiment 3 includes: the carrier compensation electrode 128 positioned between the gate electrode 126 and the bottom of the trench 122; and the insulation region 130 disposed in the trench 122, the insulation region 130 extending between the gate electrode 126 and the carrier compensation electrode 128 and extending along the side walls and the bottom of the trench 122 thus separating the carrier compensation electrode 128 from the side walls and the bottom in the trench 22. Accordingly, when the MOSFET is turned off, (1) a displacement current from the drain flows into the source electrode 134 via the carrier compensation electrode 128 and hence, the displacement current minimally flows into the gate electrode 126, and (2) a distance between a region which is not depleted in the n-type column region 114 and the gate electrode 126 becomes long and hence, a feedback capacitance Crss becomes small. Accordingly, even when a drain voltage is increased when the MOSFET is turned off and a potential of an n-type column region 114 (a non-depleted region of the n-type column region 114) is increased along with the increase of the drain voltage, the gate electrode 126 is minimally affected by a change in potential in the n-type column region 114. Accordingly, a phenomenon referred to as false turn-on (erroneous turn-on) minimally occurs.

The phenomenon referred to as false turn-on (erroneous turn-on) is a phenomenon where, in a circuit where two or more MOSFETs are connected to each other, when either one of the MOSFETs is turned on, another MOSFET is also turned on by an error due to a change in potential.

Although the present invention has been described with reference to the above-described Embodiments, the present invention is not limited to the above-described Embodiments. The present invention can be carried out in various modes without departing from the gist of the present invention. For example, the following modifications are also conceivable.

(1) The numbers, materials, shapes, positions, sizes and the like of the constitutional elements described in the above-mentioned respective Embodiments are provided only for an exemplifying purpose, and can be changed within a scope where advantageous effects of the present invention are not impaired.

Figure 9:
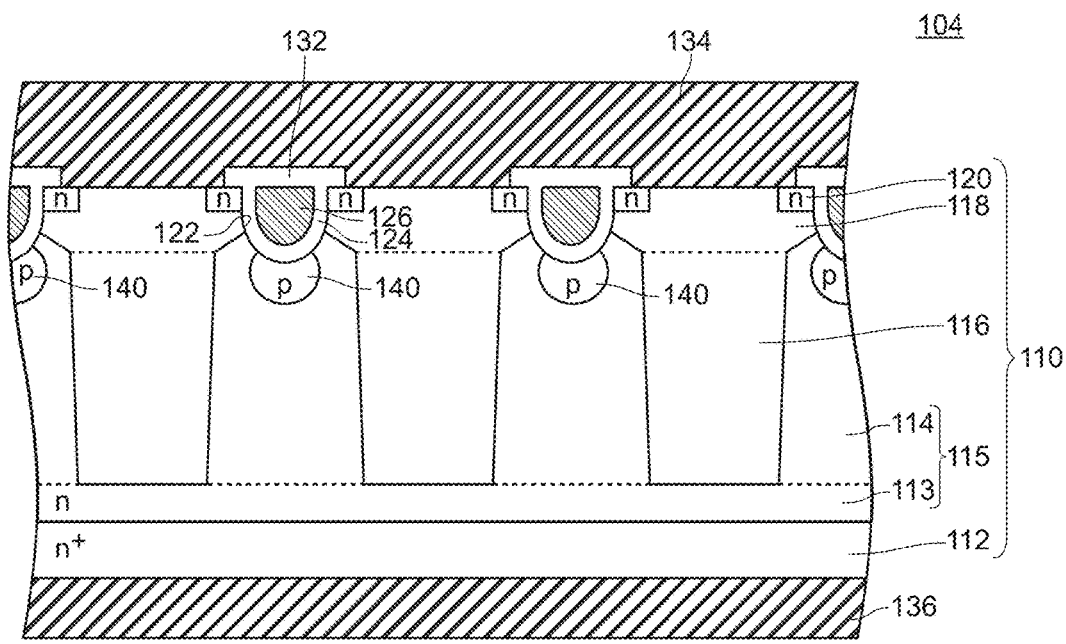
FIG. 9 is a cross-sectional view showing a MOSFET 104 according to Modification.
Figure 10:
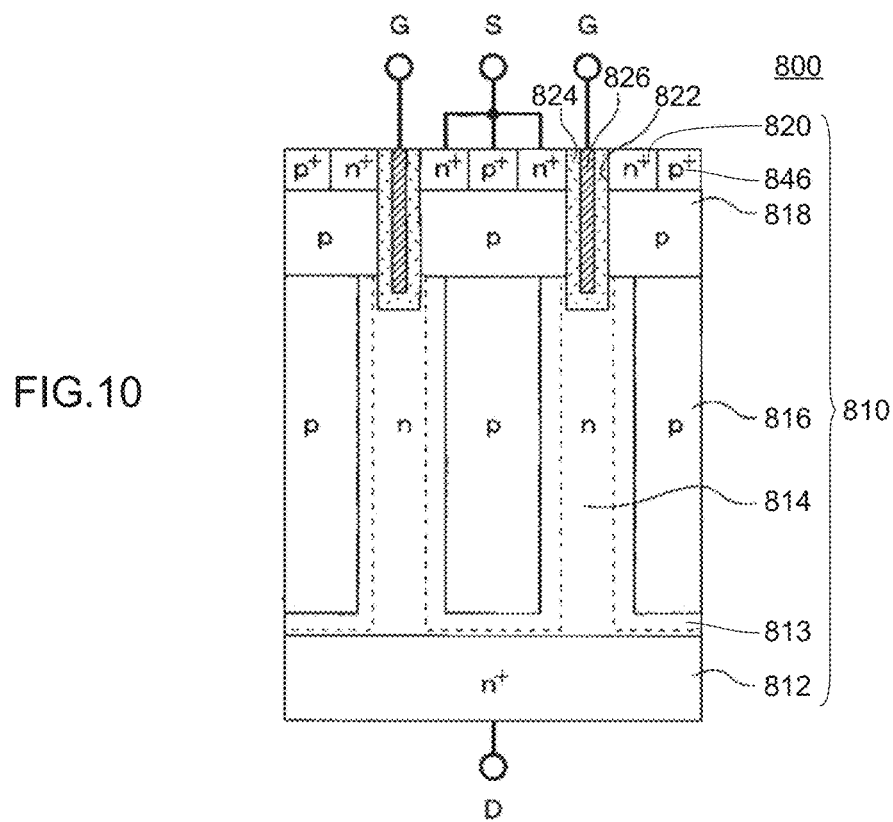
FIG. 10 is a cross-sectional view of a conventional MOSFET 800. In the drawing, symbol 812 indicates a low-resistance semiconductor layer, symbol 813 indicates a buffer layer, and symbol 846 indicates a $p^+$-type semiconductor layer.
Figure 11:
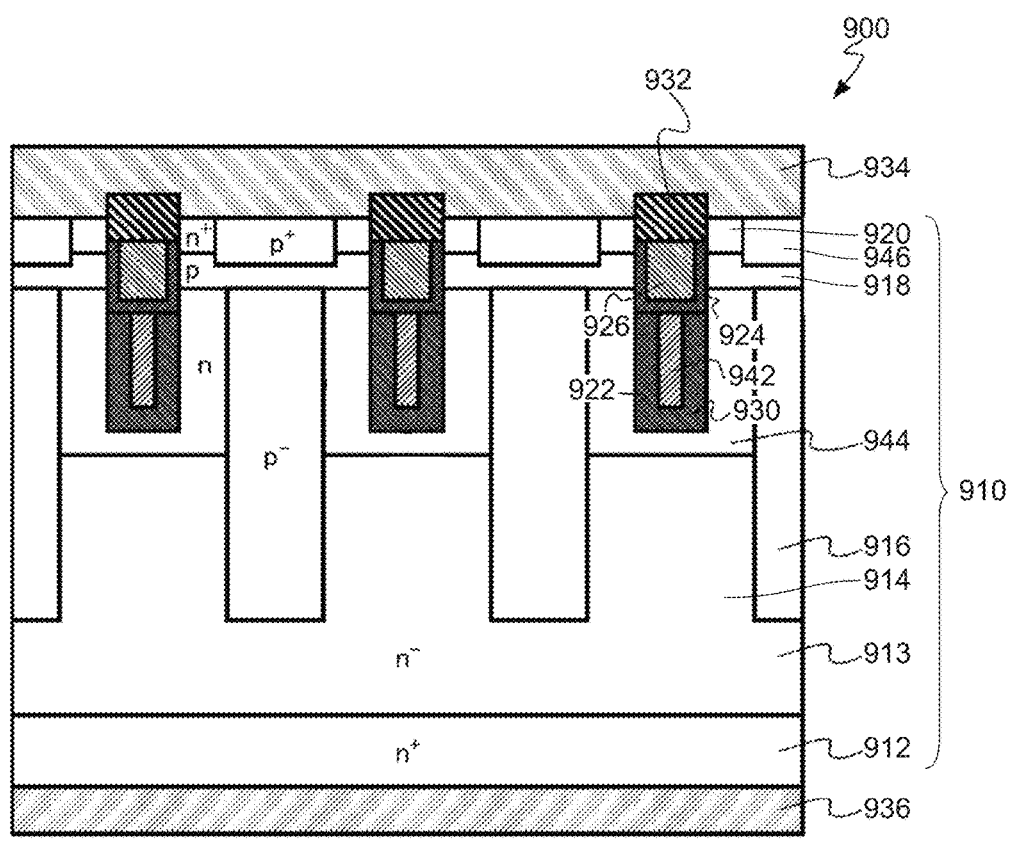
FIG. 11 is a cross-sectional view of another conventional MOSFET 900. In the drawing, symbol 910 indicates a semiconductor base substrate, symbol 912 indicates a low-resistance semiconductor layer, symbol 913 indicates a buffer layer, symbol 918 indicates a base region, symbol 920 indicates a source region, symbol 924 indicates a gate insulation film, symbol 932 indicates an interlayer insulation film, symbol 934 indicates a source electrode, symbol 936 indicates a drain electrode, and symbol 946 indicates a $p^+$-type semiconductor layer.

(2) In the above-described respective Embodiments, the carrier compensation electrode is provided in the trench. However, the present invention is not limited to such a structure. In place of providing the carrier compensation electrode in the trench, a p-type semiconductor region may be formed around the lowermost portion of the trench (see symbol 140 in FIG. 9). With such a structure, a region where a potential is high in the n-type column region can be formed at a position remote from the gate electrode 126 (that is, capable of acquiring the equipotential line distribution similar to the equipotential line distribution shown in FIG. 6A). Accordingly, a distance between the n-type column region (non-depleted n-type column region) and the gate electrode becomes long compared to that of the conventional MOSFET 800 and hence, the MOSFET according to the present invention has a small feedback capacitance Crss compared to that of the conventional MOSFET 800. As a result, also from this viewpoint, even when an irregularity in a charge balance exists around the gate, an irregularity in switching characteristics when the MOSFET is turned off can be made small.

In the case where the p-type semiconductor region 140 is formed around the lowermost portion of the trench, it is necessary that the p-type semiconductor region 140 is electrically connected to the base region 118 in the vicinity of a terminal portion (a stripe-shaped terminal portion) of the trench 122 in a region around an active region (for example, p-type semiconductor region 140 is electrically connected to the base region 118 via a p-type semiconductor region formed along a side wall of a terminal portion of the trench 122). The reason is as follows.

Assume a case where the p-type semiconductor region 140 is not electrically connected to the base region 118 in the vicinity of the terminal portion of the trench 122 in the region around an active region (a case where the p-type semiconductor region 140 is a diffusion layer in a floating state). In this case, when the MOSFET is turned off one time, a depletion layer extends to the inside of the p-type semiconductor region 140 and the n-type column region 114 around the p-type semiconductor region 140, and the depletion layer is maintained in an extended state. When the depletion layer is left for a time sufficiently longer than a lifetime of the depletion layer, the depletion layer is gradually shrunken because of electron-hole pairs which are generated in the inside of the depletion layer by thermal excitation. However, usually, with a frequency at which the MOSFET is driven, a time from a first-time turn off to a next-time turn off is shorter than a time during which the above-mentioned depletion layer constricts and hence, a conduction path for an electron current in the n-type column region 114 becomes narrow thus giving rise to a phenomenon that ON resistance is increased.

On the other hand, in the case where the p-type semiconductor region 140 is electrically connected to the base region 118 in the vicinity of a terminal portion of the trench 122 in the region around the active region, when the MOSFET is turned on, holes formed in an interface of ohmic contact between the source electrode 134 and the base region 118 flow into the p-type semiconductor region 140 via the base region 118 and an area in the vicinity of the terminal portion of the trench 122, and instantaneously constricts the depletion layer. Accordingly, a possibility is eliminated that the above-mentioned depletion layer constricts the n-type column region 114. In this manner, it is possible to prevent a conduction path for an electron current in the n-type column region 114 from becoming narrow. As a result, it is possible to prevent the occurrence of a phenomenon that ON resistance is increased.

(3) In the above-mentioned respective Embodiments, a width of the p-type column region 116 is gradually increased from a second main surface side toward a first main surface, and a width of the n-type column region 114 is gradually decreased from the second main surface side toward the first main surface. However, the present invention is not limited to such a structure. The width of the n-type column region 114 and the width of the p-type column region 116 may be set to a fixed value regardless of a depth respectively regardless of a depth.

(4) In the above-mentioned respective Embodiments, the dopant concentration in the p-type column region 116 is set to a fixed value regardless of a depth. However, the present invention is not limited to such a structure. The dopant concentration in the p-type column region 116 may be gradually increased from a second main surface side toward a first main surface. With such a structure, it is possible to acquire an advantageous effect that an L-load avalanche breakdown resistance can be increased.

(5) In the above-mentioned respective Embodiments, the n-type column region 114, the p-type column region 116, the trench 122 and the gate electrode 126 are formed in a stripe shape as viewed in a plan view. However, the present invention is not limited to such a structure. The n-type column region 114, the p-type column region 116, the trench 122 and the gate electrode 126 may be formed in a circular shape (a columnar shape as viewed stereoscopically), a quadrangular frame shape, a circular frame shape or a grid shape as viewed in a plan view.

(6) In the above-mentioned respective Embodiments, a DC power source is used as the power source. However, the present invention is not limited to such a structure. An AC power source may be used as the power source.

(7) A chopper circuit is used as the power conversion circuit in the above-mentioned Embodiments 1 and 2, while a full bridge circuit is used as the power conversion circuit in the above-mentioned Embodiment 3. However, the present invention is not limited to such a structure. As the power conversion circuit, a half bridge circuit, a three-phase AC converter, a non-insulating-type full bridge circuit, a non-insulating-type half bridge circuit, a push-pull circuit, an RCC circuit, a forward converter, a flyback converter or other circuits may be used.

(8) A PIN diode is used as the rectifier element in the above-mentioned Embodiments 1 and 2, while a built-in diode of the MOSFET is used as the rectifier element in Embodiment 3. However, the present invention is not limited to such a structure. As the rectifier element, a fast recovery diode such as a JBS or an MPS, silicon-carbide Schottky barrier diodes or other diodes may be used.

(9) In the above-mentioned Embodiment 3, as the rectifier element, only a built-in diode of the MOSFET is used. However, the present invention is not limited to such a structure. When a recovery loss of a built-in diode is excessively large, an additional rectifier element may be connected in parallel with the MOSFET.

The invention claimed is:

1. A MOSFET comprising:
a semiconductor base substrate having: an n-type column region and a p-type column region formed in an alternately arranged state; a p-type base region positioned on a surface of the n-type column region and a surface of the p-type column region; and an n-type source region positioned on a surface of the base region, wherein a super junction structure is formed of the n-type column region and the p-type column region;
a trench formed in a region where the n-type column region is positioned as viewed in a plan view, and having side walls disposed adjacently to the n-type column region, the base region and the source region and a bottom disposed adjacently to the n-type column region;
a gate electrode formed in the trench by way of a gate insulation film;
a carrier compensation electrode positioned between the gate electrode and the bottom of the trench;
an insulation region disposed in the trench, the insulation region extending between the gate electrode and the carrier compensation electrode, and extending along the side walls and the bottom of the trench thus separating the carrier compensation electrode from the side walls and the bottom; and
a source electrode positioned on a surface of the semiconductor base substrate on a first main surface side, the source electrode electrically connected to the source region and also electrically connected to the carrier compensation electrode, wherein
the semiconductor base substrate further has a low-resistance semiconductor layer formed on a surface thereof on a second main surface side which is a side opposite to the first main surface, and
assuming a thickness of the carrier compensation electrode from an uppermost portion to a lowermost portion as b and assuming a depth from a lowermost portion of the gate electrode to an uppermost portion of the low-resistance semiconductor layer as c, a relationship of $10b \leq c$ is satisfied.

2. The MOSFET according to claim 1, wherein assuming a thickness of the gate electrode from an uppermost portion to a lowermost portion as a and assuming a thickness of the carrier compensation electrode from an uppermost portion to a lowermost portion as b, a relationship of $0.2a \leq b \leq a$ is satisfied.

3. The MOSFET according to claim 1, wherein dopant concentration in the n-type column region which is a region disposed adjacently to the trench is set to dopant concentration equal to dopant concentration in the n-type column region at a lowermost portion of the n-type column region.

4. The MOSFET according to claim 1, wherein dopant concentration in the n-type column region which is a region disposed adjacently to the trench is set lower than dopant concentration in the n-type column region at a lowermost portion of the n-type column region.

5. The MOSFET according to claim 1, wherein a thickness of the insulation region between the carrier compensation electrode and the n-type column region is larger than a thickness of the gate insulation film.

* * * * *